(12) United States Patent
Ramakrishnan et al.

(10) Patent No.: US 7,105,926 B2
(45) Date of Patent: Sep. 12, 2006

(54) ROUTING SCHEME FOR DIFFERENTIAL PAIRS IN FLIP CHIP SUBSTRATES

(75) Inventors: Arun Ramakrishnan, Sunnyvale, CA (US); Anand Govind, Fremont, CA (US); Farshad Ghahghahi, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 64 days.

(21) Appl. No.: 10/720,958

(22) Filed: Nov. 24, 2003

(65) Prior Publication Data

US 2005/0110167 A1    May 26, 2005

(51) Int. Cl.
    *H01L 29/40*    (2006.01)
(52) U.S. Cl. .................. 257/773; 257/774; 257/778; 257/786
(58) Field of Classification Search ............. 257/773, 257/774, 778, 786; 29/46
See application file for complete search history.

(56) References Cited

U.S. PATENT DOCUMENTS

| | | | |
|---|---|---|---|
| 4,437,859 A | 3/1984 | Whitehouse et al. | |
| 5,686,764 A | 11/1997 | Fulcher | 527/778 |
| 5,788,673 A | 8/1998 | Young et al. | |
| 5,898,909 A * | 4/1999 | Yoshihara et al. | 455/73 |
| 6,025,647 A * | 2/2000 | Shenoy et al. | 257/775 |
| 6,133,064 A | 10/2000 | Nagarajan et al. | 438/106 |
| 6,246,121 B1 * | 6/2001 | Dandia et al. | 257/778 |
| 6,254,827 B1 * | 7/2001 | Ackley et al. | 422/68.1 |
| 6,441,499 B1 | 8/2002 | Nagarajan et al. | 257/780 |
| 6,591,410 B1 | 7/2003 | Ali et al. | 716/12 |
| 6,768,206 B1 * | 7/2004 | Hosomi | 257/774 |
| 2003/0209807 A1 * | 11/2003 | Hosomi | 257/774 |
| 2004/0099938 A1 * | 5/2004 | Kang et al. | 257/686 |

FOREIGN PATENT DOCUMENTS

| DE | 19614337 A1 | 8/1997 |
|---|---|---|
| JP | 5245197 | 9/1993 |

* cited by examiner

*Primary Examiner*—Long Pham
*Assistant Examiner*—Shrinivas H. Rao
(74) *Attorney, Agent, or Firm*—Westman, Chapman & Kelly

(57) ABSTRACT

A flip chip substrate is provided, which includes a plurality of conductive layers, including a top layer and a bottom layer. A first plurality of contacts, including first and second contacts corresponding to a differential signal pair, are arranged on the top layer within a die bonding area. A second plurality of contacts, including third and fourth contacts corresponding to the differential signal pair, are arranged on the bottom layer. First and second traces are routed between the first and third contacts and between the second and fourth contacts, respectively, wherein the second trace is routed out of the die bonding area on a different layer than the first trace. The traces are routed in a manner that reduces the length difference between the traces.

32 Claims, 3 Drawing Sheets

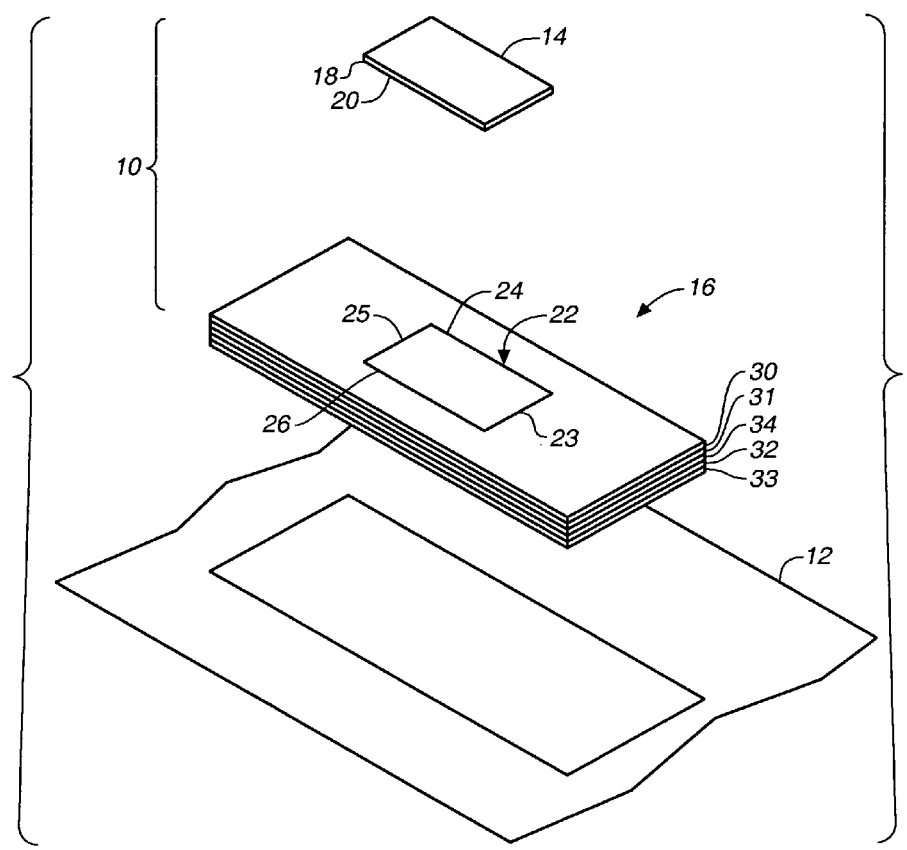
FIG._1
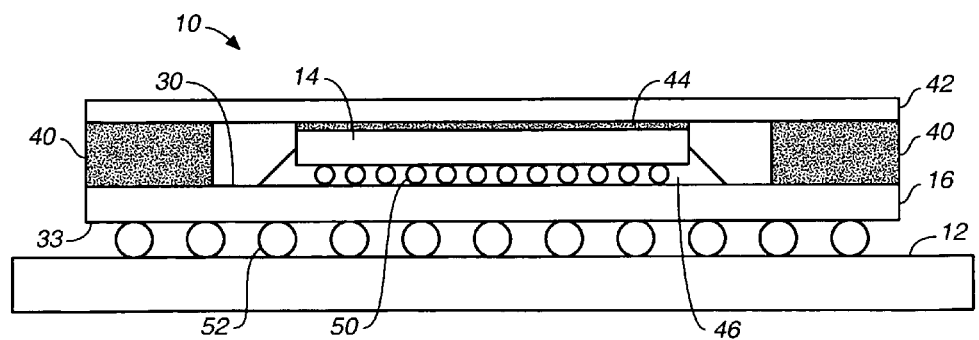
FIG._2

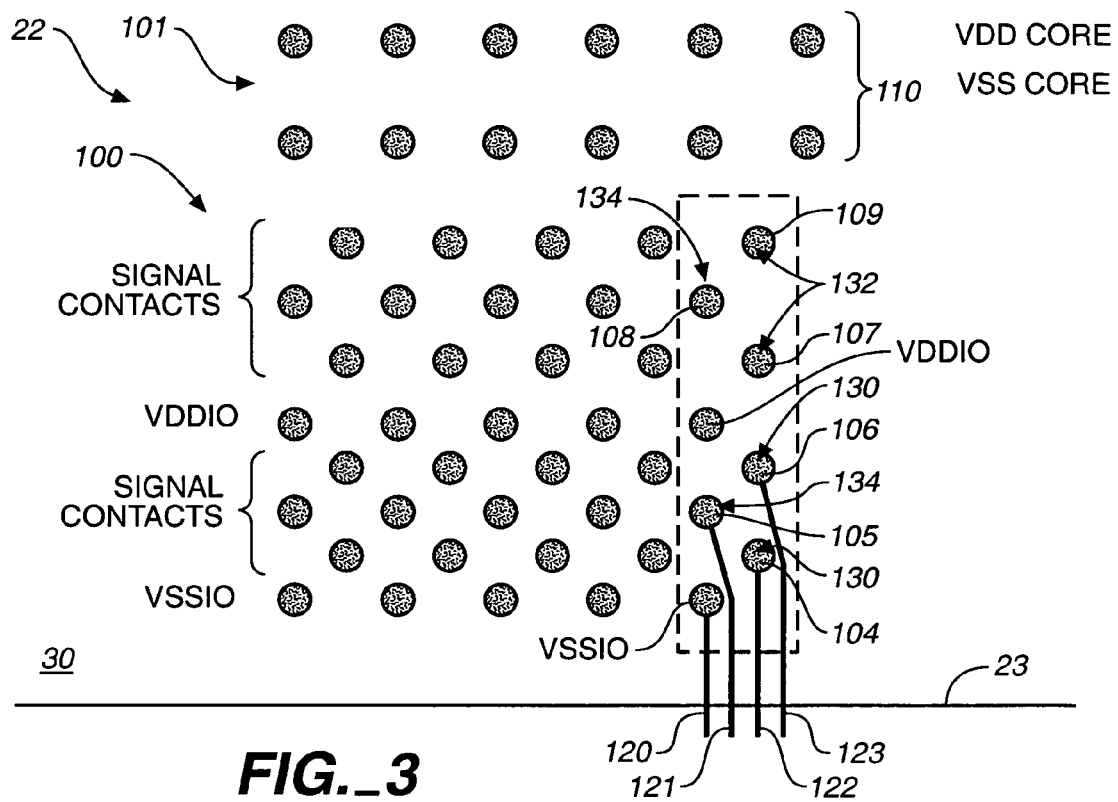
FIG._3
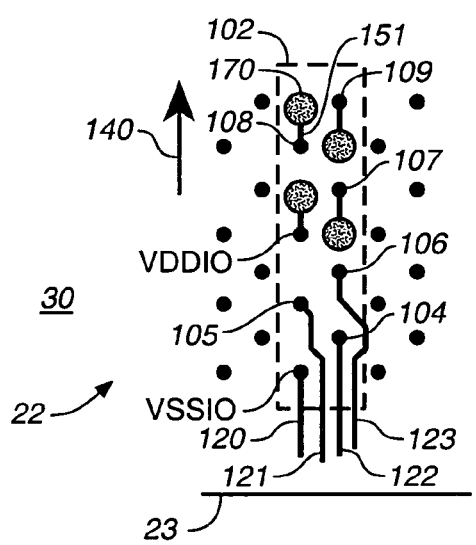
FIG._4
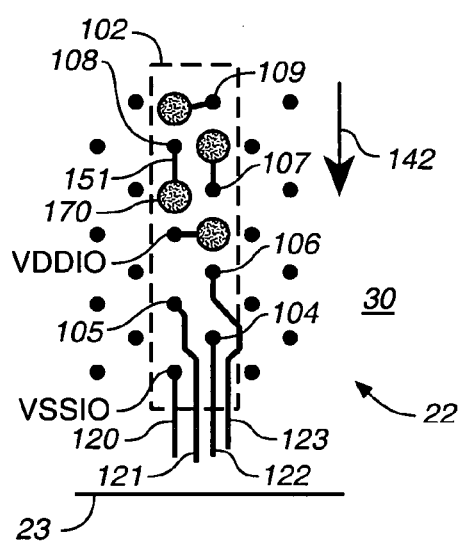
FIG._5

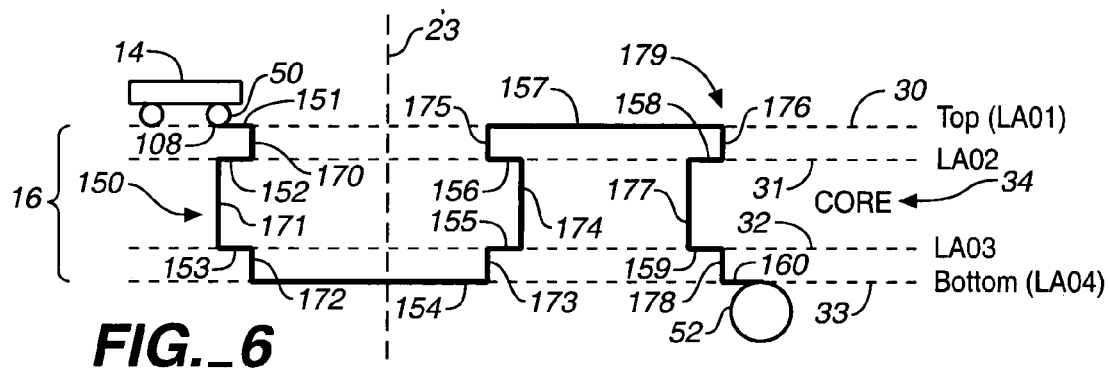
FIG._6
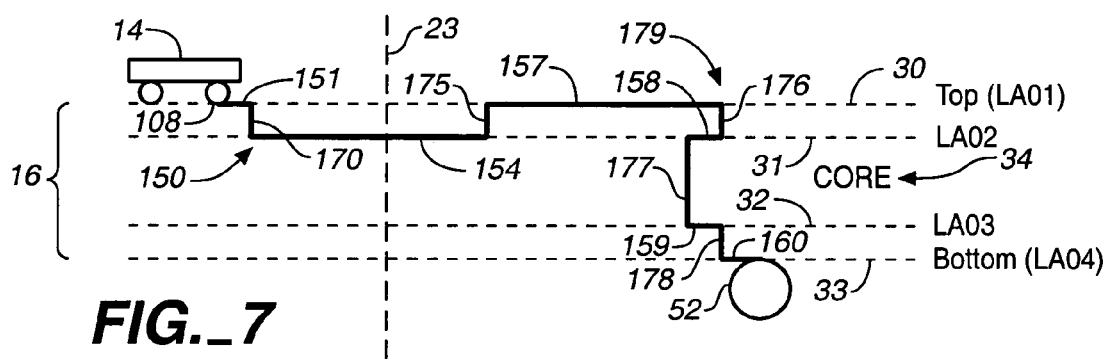
FIG._7
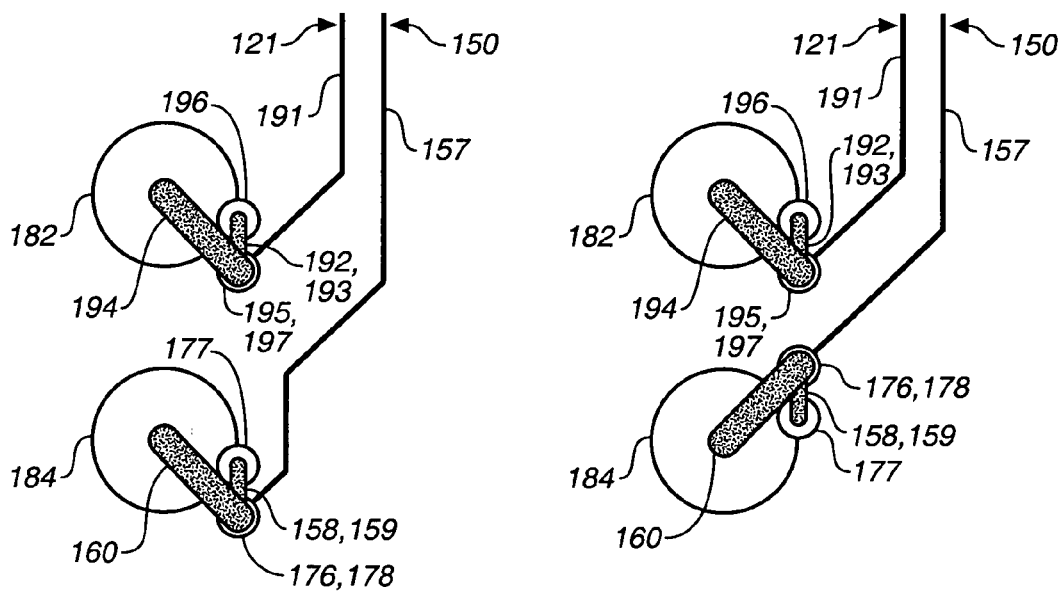
FIG._8  FIG._9

ROUTING SCHEME FOR DIFFERENTIAL PAIRS IN FLIP CHIP SUBSTRATES

FIELD OF THE INVENTION

The present invention relates to integrated circuits and more particularly to substrates used in flip chip ball grid array packages for mounting semiconductor dies to integrated circuit boards.

BACKGROUND OF THE INVENTION

A "flip chip" refers to an integrated circuit that includes at least one semiconductor die, which is bonded circuit-side down to a substrate, with direct electrical interconnection between the die and the substrate. Because the die is connected directly to the substrate, traditional bond wires are eliminated. The substrate can be a passive carrier such as a printed circuit board, or it can be another semiconductor chip. The substrate is normally bonded directly to a motherboard. Other flip chips and other integrated circuits employing a variety of more traditional packages such as lead frame packages, surface mounts, pin grid arrays and the like can also be mounted to the motherboard.

One purpose that the substrate serves is to allow the input-output (I/O) signals on the die to "escape" the die onto the motherboard. Dice are usually quite small, and contain as many as hundreds of I/O signals, as well as numerous power and ground connections. There can be "bumps" (i.e., solder spheres) on the surface pads of the die to facilitate electrical connections to the substrate. These bumps are densely packed together onto the small die. It may not be practical to attempt to bond such tightly packed bumps to a motherboard. The substrate serves the purpose of spreading out these densely packed bumps to a much less dense spacing, so that these I/O signals and power and ground connections can then be connected to the motherboard.

When the die is bonded to the substrate, the bumps on the die are the points of physical and electrical contact between the die and the substrate. The bumps carry electrical signals including power and ground to and from the die. The substrate has a surface, typically the surface opposite the die, which has a plurality of contacts called pads or lands. A solder ball is typically attached to each land for soldering to the motherboard. The solder balls are collectively referred to as a ball grid array, because they are usually arranged in a grid pattern.

Each bump in the die bonding area is electrically connected to a corresponding ball in the ball grid array through conductive segments called "traces" along one or more of the layers in the substrate and through one or more "vias" between the layers.

The I/O signals being routed through the substrate for communication between the die and motherboard can include many different types of signals, such as single-ended signals and differential signal pairs. A differential signal pair consists of two adjacent I/O contact pads within the die bonding area, which are routed to two adjacent balls in the package. Ideally, the routing for the two traces in each differential pair should be identical in terms of the length of the routes, the number of vias in the routes and the planes between which the traces are routed. However due to the density of contacts within the die bonding area and limitations of the substrate routing layers, it may not be possible to match both routes for the entire distance of the routes.

A large length difference between two traces in a differential signal pair increases the propagation delay in the longer trace, which should ideally be the same along both traces. In addition, jogs in one trace relative to the other trace increases the impedance of the jogging trace.

Improved routing schemes are desired for routing differential signal pairs along a flip chip substrate.

SUMMARY OF THE INVENTION

One embodiment of the present invention is directed to a flip chip substrate, which includes a plurality of conductive layers, including a top layer and a bottom layer. A first plurality of contacts, including first and second contacts corresponding to a differential signal pair, are arranged on the top layer within a die bonding area. A second plurality contacts, including third and fourth contacts corresponding to the differential signal pair, are arranged on the bottom layer. First and second traces are routed between the first and third contacts and between the second and fourth contacts, respectively. The second trace is routed out of the die bonding area on a different layer than the first trace and has a via in the die bonding area extending from the top layer to another of the plurality of layers. The via is laterally offset from the second contact in a direction toward the first contact.

Another embodiment of the present invention is directed to a flip chip substrate. The substrate includes a plurality of conductive layers, including a top layer and a bottom layer. A first plurality of contacts, including first and second contacts corresponding to a differential signal pair, are arranged on the top layer within a die bonding area. A second plurality contacts, including third and fourth contacts corresponding to the differential signal pair, are arranged on the bottom layer. A first trace electrically connects the first and third contacts and has a first segment extending outwardly from the first contact toward an edge of the die bonding area along the top layer. A second trace electrically connects the second and fourth contacts. The second trace extends from the second contact to a second one of the layers within the die bonding area, which is located between the top and bottom layers. The second trace extends outwardly from the die bonding area along the second layer and returns to the top layer externally to the die bonding area. The first and second traces extend along the top layer outside of the die bonding area to respective vias and extend downwardly from the respective vias toward the third and fourth contacts, respectively.

Another embodiment of the present invention is directed to a flip chip substrate including a plurality of conductive layers, including a top layer and a bottom layer. A first plurality of contacts, including first and second contacts corresponding to a differential signal pair, are arranged on the top layer within a die bonding area. A second plurality contacts, including third and fourth adjacent contacts corresponding to the differential signal pair, are arranged on the bottom layer. First and second traces are routed between the first and third contacts and between the second and fourth contacts, respectively. The first and second traces include a pair of respective vias extending from the bottom layer to another of the plurality of layers. The respective vias are laterally offset toward one another relative to centers of the third and fourth contacts, respectively.

BRIEF DESCRIPTION OF THE DRAWINGS

FIG. 1 is an exploded perspective view of a flip chip package for mounting to a motherboard, according to one embodiment of the present invention.

FIG. 2 is a cross-sectional view of the flip chip package mounted to the motherboard.

FIG. 3 is a schematic view of a greatly enlarged, fragmentary portion of a die bonding area on a substrate in the flip chip package, according to one embodiment of the present invention.

FIG. 4 is a diagram illustrating an escape routing pattern for diverting traces in the die bonding area.

FIG. 5 is a diagram illustrating an alternative escape routing pattern for diverting traces in the die bonding area.

FIG. 6 schematically illustrates a side, cross-sectional view of the substrate showing re-routing of a signal trace from a top layer to a bottom layer and back to the top layer.

FIG. 7 schematically illustrates a side, cross-sectional view of the substrate showing re-routing of a signal trace from a top layer to an intermediate layer, according to an alternative embodiment of the present invention.

FIG. 8 schematically illustrates a trace routing pattern to a pair of adjacent, corresponding solder ball contacts (i.e., solder spheres between the substrate and the printed circuit board) on the bottom layer of the substrate.

FIG. 9 schematically illustrates an alternative trace routing pattern to the pair of adjacent, solder ball contacts.

DETAILED DESCRIPTION OF ILLUSTRATIVE EMBODIMENTS

FIG. 1 is an exploded, perspective view of a flip chip 10, which can be mounted to a motherboard 12 according to one embodiment of the present invention. Flip chip 10 includes an integrated circuit die 14 and a substrate 16. Die 14 includes an integrated circuit 18 formed on a face side 20 of die 14. Die 14 is mounted face side down to substrate 16 and bonded to substrate 16 within die bonding area 22. Bonding is typically by performed by soldering, for example. Die bonding area 22 includes edges 23, 24, 25 and 26, which define a perimeter of the die bonding area.

Substrate 16 includes a plurality of conductive layers. In one embodiment, substrate 16 includes a total of four conductive layers, including a top layer 30, a second layer 31, a third layer 32 and a bottom layer 33, which are fabricated on a core 34 and are electrically isolated from one another by dielectric layers. The dielectric layers are formed of an insulting dielectric material such as polyimide, PCB laminate, Polytetrafluoroethylene (PTFE), FR4, BT resin, ceramic or any other insulator used for semiconductor packages. Also, other types of substrates can be used, such as "decals" or printed double-sided flex tape with or without stiffeners. The bottom layer 33 of substrate 16 is mounted to motherboard 12. The conductive layers on substrate 16 carry "traces" of conductive segments for interconnecting signals on die 14 with motherboard 16.

FIG. 2 is a cross-sectional view of flip chip 10 mounted to motherboard 12. Flip chip 10 has a package formed by substrate 16, stiffener 40 and heat spreader 42 and underfill 46. Heat spreader 42 is attached to die 14 with an adhesive 44.

The face side 20 of die 14 includes a plurality of "bumps" 50 (solder spheres) to facilitate electrical connections from the die to the top conductive layer 30 of substrate 16. These bumps are densely packed together onto the small die. It may not be practical to attempt to bond such tightly packed bumps to motherboard 12. Therefore, substrate 16 serves the purpose of spreading out these densely packed bumps to a much less dense spacing so that the I/O signals along with power and ground can be connected to motherboard 12.

A plurality of solder balls 52 are attached to the bottom conductive layer 33 of substrate 16 to facilitate the electrical interconnections between substrate 16 and motherboard 12. In one embodiment, solder balls 52 are arranged in a ball grid array on bottom layer 33. Solder balls 52 are much less densely packed than bumps 50. Each bump 50 is electrically connected to a corresponding one of the solder balls 52 through conductive segments in one or more of the layers in substrate 16 and through one or more electrical vias between the layers.

The I/O signals on die 14 can include different types of signals such as single-ended signals and differential signal pairs. Differential signal pairs include adjacent I/O slots that are routed from corresponding bumps 50 to adjacent solder balls 52 through substrate 16. The conductive traces through substrate 16 of each signal in a differential signal pair are ideally identical to one another in terms of the length of conductive segments, the number of vias and the layers on which the conductive segments are routed. However, this becomes difficult due to the number of I/O signals and the density of the bumps in a typical flip chip package.

FIG. 3 is a schematic view of a greatly enlarged, fragmentary portion of die bonding area 22 on the top conductive layer 30 of substrate 16, according to one embodiment of the present invention. Top conductive layer 30 includes a plurality of contacts or pads represented by circular dots in the figure. These contacts are electrically and physically connected to corresponding bumps 50 shown in FIG. 2 when integrated circuit die 14 is bonded to substrate 16.

Die bonding area 22 includes an I/O region 100 and a central region 101. I/O region 100 extends along the periphery of central region 101 for making electrical interconnections with the I/O signals in a corresponding I/O region of the die. I/O region 100 has a pattern of contacts arranged in repeating units 102. In this embodiment, each unit 102 has eight contacts, including six contacts 104–109 for I/O signals, one contact for an I/O-level power conductor ("VDDIO") and one contact for an I/O-level ground conductor ("VSSIO"). Central region 101 includes a plurality of contacts 110 for connecting to core-level power and ground conductors ("VDDCORE" and "VSSCORE").

The plurality of contacts in each unit 102 are routed outwardly from die bonding area 22 toward the nearest die edge for connection to corresponding contacts on bottom conductive layer 33 (shown in FIG. 1) through one or more conductive segments. In the case of units 102, the contacts within these regions are routed radially outward across the closest die edge 23.

Due to the dense spacing of the contacts, there is typically not enough area between the contacts to route all of the traces from each contact in a particular unit 102 directly from the contact toward the corresponding die edge, on top conductive layer 30. Therefore, some of the traces are routed outwardly on top conductive layer 30 while other traces are routed downwardly to another conductive layer such as bottom layer 33 (shown in FIG. 1) and then outwardly toward the corresponding surface pads on the bottom layer. For example, the contacts closest to die edge 23 (VSSIO and contacts 104–106) can be routed outwardly directly on top conductive layer 30 by traces 120–123, and the contacts that are located further from die edge 23 (VDDIO and contacts 107–109) can be routed downwardly to a different conductive layer, such as bottom layer 33, and then outwardly toward die edge 23.

For differential signal pairs, the individual signals are routed to adjacent signal contacts within each unit 102. For example, contacts 104 and 106 can correspond to a first differential signal pair 130, contacts 107 and 109 can correspond to a second differential signal pair 132, and contacts 105 and 108 can correspond to a third differential signal pair 134. The traces 122–123 for the first signal pair 130 can be routed together along the top conductive layer 30. The traces for the second signal pair 132 can be routed together along bottom layer 33 (shown in FIG. 1).

However, the traces for contacts 105 and 108 of the third signal pair 134 cannot be routed together within die bonding area 22. Trace 121 for contact 105 can be routed outwardly on the top conductive layer, whereas the trace for other contact 108 must be routed downwardly to a different conductive layer and then outwardly toward die edge 123. Since the traces of a differential signal pair are typically required to be routed along the same layer in the substrate, the trace for contact 108 must later be re-routed back up to top layer 30, external to bonding area 22, so it can be routed adjacent to trace 121 along top layer 30.

FIG. 4 is a diagram illustrating an example of an escape routing pattern for diverting the trace for contact 108 to a different layer. As was shown in FIG. 3, the trace 121 for the corresponding contact 105 in the differential pair is routed out of die bonding area 22 directly along top layer 30. However, the trace for contact 108 is routed along top layer 30 with conductive segment 151 for a short distance to via 170. Via 170 extends between top layer 30 and the next adjacent layer in the substrate. The center of via 170 is laterally offset from the center of contact 108 in a direction away from the nearest die edge 23, as indicated by arrow 140. This can add to the total length of the trace between contact 108 and the corresponding solder ball on the bottom layer 33 (shown in FIG. 2), as compared to the trace for the corresponding contact 105 in the differential pair.

FIG. 5 is a diagram illustrating an escape pattern according to an alternative embodiment of the present invention, which reduces the difference in lengths between the traces for contacts 105 and 108 of the differential signal pair. In this embodiment, the escape pattern is modified so that via 170, which is used for jogging the trace for contact 108 to a different layer, is laterally offset from contact 108 in a direction toward the nearest die edge 23, as shown by arrow 142. If the traces for both contacts 105 and 108 are routed radially outward from die bonding area 22 toward the nearest die edge 23, this lateral offset will reduce the trace length difference within the substrate for the differential signal pair.

FIG. 6 schematically illustrates a side, cross-sectional view of substrate 16 showing the re-routing of the signal trace from contact 108 to bottom layer 33 and back to top layer 30. In this example, substrate 16 has four conductive layers, including top layer 30 (LA01), second layer 31 (LA02), third layer 32 (LA03), and bottom layer 33 (LA04). Layers 30 and 31 are fabricated on one side of a core 34, and layers 32 and 33 are fabricated on the other side. Core 34 can be used to add stiffness to substrate 16. Core 34 can be formed of the same or different material than the dielectric material used to separate layers 30–33.

Contact 108 is electrically connected to a corresponding solder ball 52 on bottom layer 33 through a conductive trace 150 formed by conductive segments 151–160 and conductive vias 170–178. Each conductive via electrically connects a conductive segment on one layer in substrate 16 to a conductive segment on another layer in substrate 16. Trace 150 can include any number of conductive segments and vias.

As shown in FIG. 6, trace 150 is routed from contact 108 downwardly (through segments 151–153 and vias 170–172) to bottom layer 33, outwardly from the die bonding area along bottom layer 33 (through segment 154), and then upwardly (through segments 155–156 and vias 173–175) to top layer 30. On top layer 30, trace 150 is routed along segment 157 to via 176, which is located in an area 179 generally vertically from the corresponding solder ball 52-1. Trace 150 is then routed downwardly (through segments 158–159 and vias 176–178) to bottom layer 33, where segment 160 connects to solder ball 52-1. Vias 171 and 177 are known as buried vias since they interconnect segments in internal layers of substrate 16. In an alternative embodiment, vias can be used that extend between multiple layers.

By re-directing the trace for contact 108 to bottom layer 33 and then back up to top layer 30, this routing scheme can result in further length and impedance differences between the traces for contacts 105 and 108 in the differential signal pair. In one technology, for example, the routing difference can result in a length difference of as much as four millimeters.

FIG. 7 illustrates an alternative routing scheme, which further reduces the trace length difference within the substrate for a differential signal pair. Again, the same reference numerals are used in FIG. 7 as were used in FIG. 6 for ease of comparison. Instead of routing trace 150 outwardly from the die bonding area along bottom layer 33, conductive segment 154 is moved to second layer 31, which is adjacent to top layer 30, and routed outwardly along second layer 31. In this embodiment, conductive segment 154 is electrically connected between via 170 and via 175. The extent of the jog of trace 150 relative to a corresponding trace (not shown) on top layer 30 for contact 105 is therefore limited to a single layer. This eliminates conductive segments 152, 153, 155 and 156 and vias 171–174 (shown in FIG. 6), which further limits the length and impedance differences between the traces of the differential signal pair.

The length differences can also be limited by modifying the trace routing pattern near the solder balls along bottom layer 33. FIG. 8 schematically illustrates a trace routing pattern of the differential signal pair to a pair of adjacent, corresponding solder balls on bottom layer 33. The conductive segments, vias and contacts on the various layers of substrate 16 are superimposed on one another on FIG. 8.

Substrate 16 includes a pair of contacts 182 and 184 on bottom layer 33 on which the pair of solder balls can be attached. Contact 182 is electrically coupled to contact 105 through trace 121 (also shown in FIGS. 3 and 4), and contact 184 is electrically coupled to contact 108 through trace 150 (also shown in FIGS. 6 and 7).

Trace 121 includes conductive segments 191–194 and vias 195–197. Conductive segment 190 is routed along top layer 30 from contact 105 (as shown in FIGS. 4 and 5) to via 195, which extends between top layer 30 and second layer 31. Conductive segment 192 is routed along second layer 31 between via 195 and buried via 196. Buried via 196 extends between second layer 31 and third layer 32. Conductive segment 193 extends between buried via 196 and via 197, along third layer 32. Via 197 extends between third layer 32 and bottom layer 33. Conductive segment 194 extends between via 197 and solder ball contact 182 along bottom layer 33. Vias 195 and 197 are laterally offset from the center of contact 182 in a direction toward contact 184.

Similarly, trace 150 includes a conductive segment 157, which is routed along top layer 30 to via 176 (as also shown in FIGS. 6 and 7). Conductive segment 158 is routed along second layer 31 between via 176 and buried via 177. Buried via 177 extends between second layer 31 and third layer 32. Conductive segment 159 extends between buried via 177 and via 178, along third layer 32. Via 178 extends between third layer 32 and bottom layer 33. Conductive segment 160 extends between via 178 and solder ball contact 184 along bottom layer 33.

Since the same design rules are often applied when routing the various conductive segments in traces 121 and 150 and when positioning the corresponding vias, both vias 178 and 197 (between bottom layer 33 and third layer 32) are offset in the same direction e.g., downward in FIG. 8 from the center of their corresponding solder ball contacts 182 and 184. This contributes to the length differences between traces 121 and 150, and in particular the length differences between conductive segments 157 and 191 on top layer 30. Conductive segment 157 has a longer path to connect to corresponding via 176 than is required for conductive segment 191 to connect with corresponding via 195.

FIG. 9 is a schematic diagram of an alternative routing scheme having a modified lateral offset on bottom layer 33. The same references numerals are used in FIG. 9 and were used in FIG. 8 for the same or similar elements. The locations of conductive segments 158, 159 and 160 and vias 176 and 178 have been moved such that via 178 and conductive segment 160 on bottom layer 33 are laterally offset from the center of contact 184 in a direction toward the corresponding contact 182 in the differential pair. Therefore, the conductive segments 160 and 194 and vias 178 and 197 on bottom layer 33 for both traces in the differential pair are laterally offset toward one another relative to the contact pads within the ball grid array. This further reduces the length and impedance differences between traces 121 and 150.

With the above-modifications shown in FIGS. 5, 7 and 9, the trace lengths of a differential signal pair through a flip chip substrate can be better matched with one another. For example, the trace length difference can be reduced from 4.54 millimeters to 2.23 millimeters for a specific technology as compared to the trace length difference of the routing patterns shown in FIGS. 4, 6 and 8 for a representative routing pattern of a given technology. With the above modifications, the routing on the motherboard (shown in FIG. 1) does not have to be greatly modified to match trace mismatches in the flip chip package. This simplifies the routing on the motherboard. The above-modifications can be implemented on all multi-layer flip chip packaging technologies having differential signal pairs on the die that are routed to adjacent balls in the package.

Although the present invention has been described with reference to preferred embodiments, workers skilled in the art will recognize that changes may be made in form and detail without departing from the spirit and scope of the invention.

What is claimed is:

1. A flip chip substrate comprising:
a plurality of conductive layers, including a top layer and a bottom layer;
a first plurality of contacts, including first and second contacts corresponding to a differential signal pair, which are arranged on the top layer within a die bonding area;
a second plurality of contacts, including third and fourth contacts corresponding to the differential signal pair, which are arranged on the bottom layer; and
first and second traces routed between the first and third contacts and between the second and fourth contacts, respectively, wherein the second trace is routed out of the die bonding area on a different one of the layers than the first trace and comprises a via in the die bonding area extending from the top layer to another of the plurality of layers, wherein the via is laterally offset from the second contact in a direction toward the first contact.

2. The flip chip substrate of claim 1 wherein:
the first trace is routed outwardly from the first contact toward an edge of the die bonding area along the top layer; and
the second trace is routed from the second contact to the different layer and outwardly toward the edge of the die bonding area along the different layer.

3. The flip chip substrate of claim 2 wherein the edge of the die bonding area is a nearest edge of the die bonding area to the first and second contacts.

4. The flip chip substrate of claim 2 wherein the different layer comprises the bottom layer, which is non-adjacent to the top layer.

5. The flip chip substrate of claim 2 wherein the different layer is disposed between the top layer and the bottom layer.

6. The flip chip substrate of claim 5 wherein the different layer is immediately adjacent to the top layer.

7. The flip chip substrate of claim 2 wherein:
the second trace is routed from the different layer back up to the top layer externally to the die bonding area; and
the first and second traces extend along the top layer outside of the die bonding area to respective vias located externally to the die bonding area and are routed downwardly from the respective vias toward the third and fourth contacts, respectively.

8. The flip chip substrate of claim 7 wherein the respective vias are located in a region on the top layer that is generally vertical of the third and fourth contacts.

9. The flip chip substrate of claim 1 wherein the first and second contacts form a pair of adjacent signal contacts in the die bonding area.

10. The flip chip substrate of claim 1 wherein the third and fourth contacts form a pair of adjacent signal contacts on the bottom layer, external to the die bonding area.

11. The flip chip substrate of claim 1 wherein the second contact is located further from a nearest edge of the die bonding region than the first contact.

12. The flip chip substrate of claim 1 wherein:
the third and fourth contacts are adjacent to one another on the bottom layer; and
the first and second traces comprise respective vias extending from the bottom layer to another of the plurality of layers, wherein the respective vias are laterally offset toward one another relative to centers of the third and fourth contacts, respectively.

13. A flip chip substrate comprising:
a plurality of conductive layers, including a top layer and a bottom layer;
a first plurality of contacts, including first and second contacts corresponding to a differential signal pair, which are arranged on the top layer within a die bonding area;
a second plurality of contacts, including third and fourth contacts corresponding to the differential signal pair, which are arranged on the bottom layer;
a first trace electrically connecting the first and third contacts and having a first segment extending outwardly from the first contact toward an edge of the die bonding area along the top layer; and
a second trace electrically connecting the second and fourth contacts, wherein the second trace extends from the second contact to a second one of the layers within the die bonding area, which is located between the top and bottom layers, extends outwardly from the die bonding area along the second layer, and returns to the top layer externally to the die bonding area, and wherein the first and second traces extend along the top layer outside of the die bonding area to respective vias and extend downwardly from the respective vias toward the third and fourth contacts, respectively.

14. The flip chip substrate of claim 13 wherein the second trace comprises a further via extending from the top layer to the second layer within the die bonding area and wherein the further via is laterally offset from a center of the second contact in a direction toward the first contact.

15. The flip chip substrate of claim 13 wherein the first and second traces are routed outwardly along the top and second layers, respectively, toward a nearest edge of the die bonding area to the first and second contacts.

16. The flip chip substrate of claim 13 wherein the second layer is immediately adjacent to the top layer.

17. The flip chip substrate of claim 13 wherein the respective vias are located adjacent to one another in a region on the top layer that is generally vertical of the third and fourth contacts.

18. The flip chip substrate of claim 13 wherein the first and second contacts form a pair of adjacent signal contacts in the die bonding area.

19. The flip chip substrate of claim 13 wherein the third and fourth contacts form a pair of adjacent signal contacts on the bottom layer, external to the die bonding area.

20. The flip chip substrate of claim 13 wherein the second contact is located further from a nearest edge of the die bonding region than the first contact.

21. The flip chip substrate of claim 13 wherein:
the third and fourth contacts are adjacent to one another on the bottom layer; and
the first and second traces comprise a second pair of respective vias extending from the bottom layer to another of the plurality of layers, wherein the second pair of respective vias are laterally offset toward one another relative to centers of the third and fourth contacts, respectively.

22. A flip chip substrate comprising:
a plurality of conductive layers, including a top layer and a bottom layer;
a first plurality of contacts, including first and second contacts corresponding to a differential signal pair, which are arranged on the top layer within a die bonding area;
a second plurality of contacts, including third and fourth adjacent contacts corresponding to the differential signal pair, which are arranged on the bottom layer; and
first and second traces routed between the first and third contacts and between the second and fourth contacts, respectively, the first and second traces comprising a pair of respective vias extending from the bottom layer to another of the plurality of layers, wherein the pair of respective vias are laterally offset toward one another relative to centers of the third and fourth contacts, respectively.

23. The flip chip substrate of claim 22 wherein:
the second trace is routed out of the die bonding area on a different one of the layers than the first trace and comprises a via in the die bonding area extending from the top layer to another of the plurality of layers, and wherein the via is laterally offset from the second contact in a direction toward the first contact.

24. The flip chip substrate of claim 23 wherein:
the first trace is routed outwardly from the first contact toward an edge of the die bonding area along the top layer; and
the second trace is routed from the second contact to the different layer and outwardly toward the edge of the die bonding area along the different layer.

25. The flip chip substrate of claim 23 wherein the edge of the die bonding area is a nearest edge of the die bonding area to the first and second contacts.

26. The flip chip substrate of claim 23 wherein the different layer comprises the bottom layer, which is non-adjacent to the top layer.

27. The flip chip substrate of claim 23 wherein the different layer is disposed between the top layer and the bottom layer.

28. The flip chip substrate of claim 27 wherein the different layer is immediately adjacent to the top layer.

29. The flip chip substrate of claim 23 wherein:
the second trace is routed from the different layer back up to the top layer externally to the die bonding area; and
the first and second traces extend along the top layer outside of the die bonding area to a second pair of respective vias located externally to the die bonding area and are routed downwardly from the second pair of respective vias toward the first pair of respective vias, respectively.

30. The flip chip substrate of claim 29 wherein the second pair of respective vias are located in a region on the top layer that is generally vertical of the third and fourth contacts and the first pair of respective vias.

31. The flip chip substrate of claim 22 wherein the first and second contacts form a pair of adjacent signal contacts in the die bonding area.

32. The flip chip substrate of claim 22 wherein the second contact is located further from a nearest edge of the die bonding region than the first contact.

* * * * *